United States Patent [19]

Motakef

[11] Patent Number: 4,822,449
[45] Date of Patent: Apr. 18, 1989

[54] HEAT TRANSFER CONTROL DURING CRYSTAL GROWTH

[75] Inventor: Shahryar Motakef, Newton, Mass.

[73] Assignee: Massachusetts Institute of Technology, Cambridge, Mass.

[21] Appl. No.: 61,117

[22] Filed: Jun. 10, 1987

[51] Int. Cl.$^4$ ............................................... C30B 15/34
[52] U.S. Cl. ..................................... 156/601; 422/245
[58] Field of Search .............. 156/601, 617 SP, 617.1; 422/245

[56] References Cited

U.S. PATENT DOCUMENTS

| | | | |
|---|---|---|---|
| 4,000,977 | 1/1977 | Falckenberg | 156/615 |
| 4,248,645 | 2/1981 | Jewett | 156/601 |
| 4,267,010 | 5/1981 | Bates et al. | 156/608 |
| 4,314,128 | 2/1982 | Chitre | 156/DIG. 73 |
| 4,417,944 | 11/1983 | Jewett | 156/DIG. 73 |
| 4,461,671 | 7/1984 | Seifert et al. | 156/DIG. 88 |
| 4,584,054 | 4/1986 | Holland | 156/DIG. 72 |
| 4,610,754 | 9/1986 | Gaida et al. | 156/601 |
| 4,645,560 | 2/1987 | Matsumoto et al. | 156/617 SP |
| 4,664,742 | 5/1987 | Tomizawa et al. | 156/617 SP |
| 4,686,091 | 8/1987 | Washizuka et al. | 156/617 SP |

FOREIGN PATENT DOCUMENTS 0104559 4/1984 European Pat. Off. .

Primary Examiner—William R. Dixon, Jr.
Assistant Examiner—Andrew Griffis

[57] ABSTRACT

Heat transfer from the surface of a crystal during crystal growth is controlled by surrounding the crystal with plural coaxial heat transfer modules. The heat transfer modules are stacked along the crystal axis. Each module includes apparatus for monitoring a temperature drop across a radially extending gradient region of the module. A heating element in the module responsive to the temperature drop controls heat transfer through the module which is equal to the heat transfer from the crystal surface at the axial location of the module. The control system also controls heat transfer from the top of the crystal by controlling the temperature to which the crystal top radiates. Control of heat transfer from the crystal surface prevents excessive thermal stress experienced by the crystal solid during growth reducing the presence of massive dislocation networks.

5 Claims, 1 Drawing Sheet

HEAT TRANSFER CONTROL DURING CRYSTAL GROWTH

BACKGROUND OF THE INVENTION

The Government has rights in this invention pursuant of Grant Number F33615-83-C-5089 awarded by the Dept. for the Air Force.

This invention relates to a heat transfer control system for controlling temperature and temperature gradient related defects generated in a crystal during growth by regulating thermal stress in the growing crystal.

Recent advances in high performance integrated circuit technologies have resulted in increased demand for high quality, large diameter semi-insulating material such as gallium arsenide, GaAs. Gallium arsenide is a III–V semiconductor material referring to the groups to which gallium and arsenic belong in the Periodic Table.

The primary crystalline defect in III–V semiconductor crystals grown by the LEC (liquid encapsulated Czochralski) technique is the presence of massive dislocation networks resulting from excessive thermal stresses experienced by the crystal solid during growth. Significant reduction in the density of dislocation is required for improved performance of opto-electronic as well as digital and monolithic IC devices utilizing these crystals. It has been recognized for several years that reduction of thermal stress levels below the plasticity limit requires, in principle, a reduction of temperature gradients in the solid to below critical values. Known attempts to control temperature gradients in the solid involve control of the environmental temperature distribution surrounding the crystal during growth. The known techniques have not, however, resulted in the production of dislocation-free GaAs crystals having a diameter on the order of three inches.

SUMMARY OF THE INVENTION

The apparatus for controlling heat flux from a crystal surface during crystal growth from a melt includes plural coaxial heat transfer modules surrounding the crystal and stacked along the crystal axis. The modules may be separated from one another by an insulating material. Each module includes temperature sensing devices for monitoring a temperature drop across a radially extending gradient region of the module. The module also includes a heating element responsive to the temperature drop to control heat flux through the module. In preferred embodiments, the coaxial heat transfer system penetrates into the melt for interface morphology control and extends beyond the crystal top to control heat transfer from the crystal top. The heat flux modules are mounted in a housing which forms a heat exchange cavity.

In a preferred embodiment, each heat transfer module includes a first high temperature material (ceramic or nickel) element facing the crystal and including a first temperature monitoring thermocouple. A second high temperature material element is radially spaced from the first high temperature material element and includes a second temperature monitoring thermocouple. An insulating member is disposed between the first and second high temperature material elements to create the gradient region across which the temperature drop is measured. It is preferred that this insulating member have low thermal conductivity to increase the temperature drop across the gradient region to provide high sensitivity.

DESCRIPTION OF THE PREFERRED EMBODIMENT

The invention disclosed herein reduces the thermal stress levels in crystals to below the critical resolveld shear stress (CRSS) values of the matrix. This is achieved by controlling the heat flux from the crystal surface by surrounding the growing crystal with a coaxial heat transfer control system. The design of the heat transfer control system to be described in detail below is based on analytical results obtained from the thermoelastic study of III–V crystals grown by the LEC technique. This study indicates that since thermal stresses in the crystal are controlled by temperature gradients in the solid, the appropriate parameter to be controlled is the heat transfer from the crystal surface, not the environmental temperature distribution. The maximum rate of heat flux from the crystal (required for practical growth rates) consistent with maintaining the thermal stress levels below the plasticity limit are dynamically infuenced by crystal length.

Figure 1:
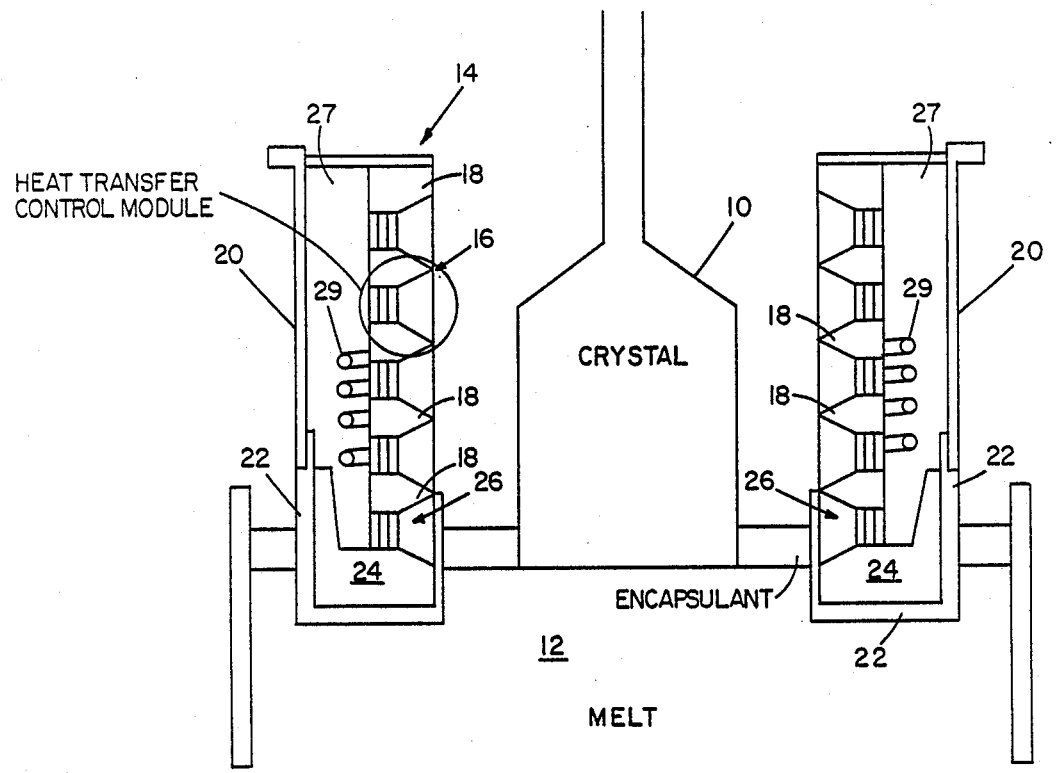
FIG. 1 is a cross-sectional, elevation view of the invention disclosed herein.

The heat transfer control apparatus for regulating thermal stresses in a growing crystal is shown in FIG. 1. A crystal 10 such as GaAs or InP is being grown from a melt 12. A heat transfer control system 14 surrounds the crystal 10 and is coaxial with it. The heat control system 14 includes a plurality of modules such as the circled module 16 stacked one on top of the other. The modules extend beyond the top of the crystal 10 to control heat flux from the top surface. The modules are separated from one another by a low thermal conductivity insulation material 18. Because of the thermal isolation of the individual modules 16, heat flux from the crystal at any axial location is equal to the heat transfer through the corresponding module. The heat transfer control modules 16 are mounted within a housing 20 preferably made of INCONEL 9 nickel-base alloy of steel. A lower portion 22 of the housing 20 is designed to penetrate into the melt 12 so as to provide the additional capability of interface morphology control by controlling the radial temperature gradient at the solidification interface. The lower portion 22 which penetrates into the melt 12 is made of boron nitride to reduce potential contamination of the melt 12. A thick piece of insulating material 24 thermally isolates the system 14 from the melt 12 to provide the accuracy needed for the control of heat flux through a lowermost module 26. Heat from the modules is extracted from a cavity 27 in the housing 20 by natural and/or forced convection of a coolant which may be the ambient gas or a fluid coolant pumped through a wound coaxial piping system 29 made of a high temperature material.

Figure 2:
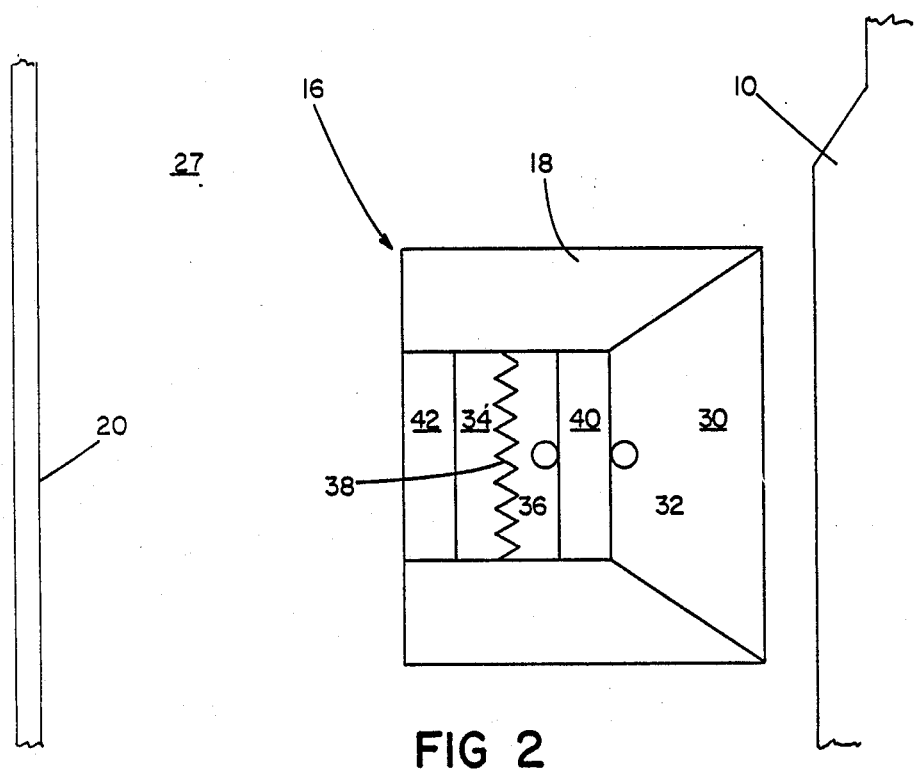
FIG. 2 is a cross-sectional, elevation view of a heat transfer control module.

FIG. 2 shows one of the heat transfer control modules 16 in more detail. The module 16 includes a first high temperature ceramic element 30 which faces the crystal 10. Mounted within the first ceramic element 30 is a first thermocouple 32. A second ceramic element 34 includes a second thermocouple 36 and a heating element 38. The second ceramic element 34 is separated from the first ceramic element 30 by a low thermal conductivity insulating material 40. An insulating element 42 along with the insulating elements 18 completes the structure of the heat transfer control module 16. The region between the heat transfer control module 16 and the housing 20, preferably of INCONEL, a nickel-base alloy of steel, forms the heat exchange cavity 27.

Heat flux through each of the modules 16, and therefore heat flux from the crystal surface, is controlled independently by monitoring the temperature drop across the gradient region between the thermocouples 32 and 36 and adjusting the power into the heating element 38 to achieve the desired magnitude of heat flux. The insulating material 40 between the ceramic elements 30 and 34 is a low thermal conductivity material to provide high sensitivity in measuring the temperature drop across the insulator 40. The heat flux across each module 16 is direcly proportional to the heat flux at the crystal periphery so that the need for accurate quantification of the heat atransfer modes in the frowth furnace is eliminated. By controlling the heating element 38 in response to the outputs of the thermocouples 32 and 36, the heat flux from the surface of the crystal 10 is controlled so that the thermal stress level in the growing crystal is maintained below the critical resolved shear stress value. In this way, large diameter crystals are grown which are substantially dislocation free.

What is claimed is:

1. Method for growing a crystal from a melt comprising controlling the heat flux from the crystal surface so that the thermal stress levels are maintained below the critical resolved shear stress value of the crystal matrix by monitoring radial heat flux from the crystal and, responsive to the monitored heat flux, by controlling the as-monitored radial heat flux in the growing crystal, and by simultaneously monitoring and controlling the temperature to which the top of the growing crystal radiates.

2. The method of claim 1 wherein controlling the heat transfer from the crystal comprises surrounding the crystal with plural coaxial heat transfer modules stacked along the crystal axis, monitoring a temperature drop across a radially extending gradient region of the module, and energizing a heating element within the module to control heat transfer through the module.

3. The method of claim 1 wherein the crystal is GaAs.

4. The method of claim 1 wherein the crystal is a III–V crystal.

5. The method of claim 1 wherein the crystal is grown by the Czochralski technique.

* * * * *

UNITED STATES PATENT AND TRADEMARK OFFICE
CERTIFICATE OF CORRECTION

PATENT NO. : 4,822,449
DATED : April 18, 1989
INVENTOR(S) : Shahryar Motakef

It is certified that error appears in the above-identified patent and that said Letters Patent is hereby corrected as shown below:

Column 1, line 52, change "transfer" to --flux--;
         line 53, change "flux" to --transfer--.
Column 2, line 11, change "resolveld" to --resolved--;
         line 22, change "transfer" to --flux--;
         line 44, change "9" to --a--;

Column 3, line 19, change "a transfer" to --transfer--;
         line 19, change "frowth" to --growth--.
Column 4, line 15, change "transfer" to --flux--.

Signed and Sealed this

Sixteenth Day of January, 1990

*Attest:*

JEFFREY M. SAMUELS

*Attesting Officer*      *Acting Commissioner of Patents and Trademarks*